(12) United States Patent
Bolanos et al.

(10) Patent No.: US 9,333,704 B2
(45) Date of Patent: May 10, 2016

(54) ULTRASONIC WELDING

(71) Applicant: Apple Inc., Cupertino, CA (US)

(72) Inventors: Gerardo Salas Bolanos, Cupertino, CA (US); Simon R. Lancaster-Larocque, Gloucester (CA); Dominic E. Dolci, Cupertino, CA (US); Cesar Lozano, Cupertino, CA (US); James G. Smeenge, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 534 days.

(21) Appl. No.: 13/842,626

(22) Filed: Mar. 15, 2013

(65) Prior Publication Data

US 2014/0078711 A1 Mar. 20, 2014

Related U.S. Application Data

(60) Provisional application No. 61/702,182, filed on Sep. 17, 2012.

(51) Int. Cl.
*B32B 37/00* (2006.01)
*B29C 65/08* (2006.01)
*H05K 5/00* (2006.01)
(Continued)

(52) U.S. Cl.
CPC ............... *B29C 65/08* (2013.01); *B23K 20/10* (2013.01); *B23K 33/004* (2013.01); *B29C 65/7802* (2013.01); *B29C 65/7841* (2013.01); *B29C 66/1222* (2013.01); *B29C 66/1224* (2013.01); *B29C 66/30223* (2013.01); *B29C 66/542* (2013.01); *B29C 66/7392* (2013.01); *B29C 66/8322* (2013.01); *B29C 66/8324* (2013.01); *B29C 66/9241* (2013.01); *B29C 66/9261* (2013.01); *B29C 66/93451* (2013.01); *B29C 66/9512* (2013.01); *B29C 66/9516* (2013.01); *H05K 5/0004* (2013.01); *B23K 2203/00* (2013.01); *B29C 66/1122* (2013.01); *B29C 66/41* (2013.01); *B29C 66/71* (2013.01); *B29C 66/73115* (2013.01); *B29C 66/8242* (2013.01); *B29C 66/8618* (2013.01);
(Continued)

(58) Field of Classification Search
CPC B23K 20/10; B29C 65/7802; B29C 65/7841; B29C 66/30223; B29C 66/542; B29C 66/7392; B29C 66/8324; B29C 66/9241; B29C 66/9261; B29C 66/93451; B29C 66/9512; B29C 66/9516; H05K 5/0004
USPC .................................. 156/73.1, 580.1, 580.2
See application file for complete search history.

(56) References Cited

U.S. PATENT DOCUMENTS 4,618,516 A * 10/1986 Sager .................. B29C 37/0082
156/153
5,011,555 A * 4/1991 Sager .................. B01D 29/012
156/580.2
(Continued)

*Primary Examiner* — James Sells
(74) *Attorney, Agent, or Firm* — Downey Brand LLP

(57) ABSTRACT

The described embodiments relate generally to ultrasonic welding and more particularly to performing an ultrasonic welding operation while rotating one part relative to a mating part. A non-uniform energy director can be disposed along a mating surface of a first part. The energy director can maintain a constant cross-sectional area while having a smaller height near a pivot point for the rotation and a larger height away from the pivot point. The varying height of the energy director can allow the tip of the energy director to come in contact with a second part rotating relative to the first part at approximately the same time during the ultrasonic welding process.

20 Claims, 10 Drawing Sheets

(51) Int. Cl.
*B23K 20/10* (2006.01)
*B23K 33/00* (2006.01)
*B29C 65/78* (2006.01)
*B29C 65/00* (2006.01)
*B29L 31/34* (2006.01)
*H01R 13/504* (2006.01)

(52) U.S. Cl.
CPC ........ *B29C 66/9672* (2013.01); *B29C 66/9674* (2013.01); *B29L 2031/3481* (2013.01); *H01R 13/504* (2013.01)

(56) References Cited

U.S. PATENT DOCUMENTS 6,577,830 B1 * 6/2003 Wazana ............. G03G 15/0877
 156/73.5
7,248,813 B2 * 7/2007 Burton ............... G03G 15/0894
 399/109
7,618,507 B2 * 11/2009 Wazana .................. B29C 65/08
 156/73.1

* cited by examiner

ULTRASONIC WELDING

CROSS-REFERENCE TO RELATED APPLICATIONS

This application claims the benefit of U.S. Provisional Patent Application No. 61/702,182, filed Sep. 17, 2012 and entitled "ULTRASONIC WELDING" by LANCASTER-LAROCQUE et al., which is incorporated by reference in its entirety for all purposes.

FIELD OF THE DESCRIBED EMBODIMENTS

The described embodiments relate generally to ultrasonic welding and more particularly to performing an ultrasonic welding operation while rotating one part relative to a mating part.

BACKGROUND

Ultrasonic welding is an industrial manufacturing process where high frequency ultrasonic acoustic vibrations can be applied to mating parts held together under pressure to create a solid-state weld. Ultrasonic welding can be preferable to other bonding methods in high volume manufacturing environments due to short weld times and ease of automation. When forming an ultrasonic weld between two parts, it can be common to include an energy director molded into one of the mating parts. An energy director can include a triangular shaped ridge molded into the mating surface of one of the parts. This energy director can limit initial contact between the mating parts to a very small area, and can focus the ultrasonic energy at the apex of the triangular ridge. During the welding process, the concentrated ultrasonic energy can cause the ridge to melt and the melted material to flow throughout a joint area, bonding the parts together.

When forming an ultrasonic weld, it can be advantageous for the entire length of the energy director to impact a mating part at approximately the same time. This can prevent an excessive amount of ultrasonic energy from being concentrated through one portion of the energy director at any time during the welding operation. Excessive energy concentrated in one area can lead to a weaker bond or cause more of the part than the energy director to melt. Sometimes space restraints can require that the two mating parts rotate relative to each other during the ultrasonic welding process. This can pose a problem because a portion of the energy director near the pivot point of the rotation can come into contact with the mating part first. The resulting uneven contact between the energy director and the mating part can result in a weaker bond and can risk damaging the parts being welded.

Therefore, what is desired is a method for ultrasonically welding two parts together where one part must rotate relative to the other part during the welding operation.

SUMMARY OF THE DESCRIBED EMBODIMENTS

This paper describes various embodiments that relate to a method for ultrasonically welding two parts together while rotate the parts relative to one another during the welding process. In one embodiment, a method for ultrasonically welding is described. The method includes at least the following steps: (1) forming an energy director with a non-uniform cross-sectional area on a surface of a first part configured to mate with a second part, and (2) applying a vibrational energy to the energy director while rotating the second part relative to the first part. The height of the non-uniform cross-section increases proportional to a distance from an axis of rotation for the second part. This varying height allows an entirety of the energy director to contact a mating surface on the second part at approximately the same time.

In another embodiment, a power adapter is described. The power adapter includes a housing with an opening and a mating surface surrounding the opening. In addition, an AC inlet is disposed within the opening in the housing. The AC inlet has a mating surface configured to align with the mating surface on the housing. Furthermore, the AC inlet is designed to rotate relative to the housing as the AC inlet is installed into the power adapter. An energy director having a non-uniform cross-section is formed on the mating surface of the AC inlet. The height of the non-uniform cross-section increases proportional to a distance from an axis of rotation for the AC inlet during the installation process.

In yet another embodiment, a system for ultrasonically welding a first part to a second part while rotating the second part relative to the first part is described. The system includes a transducer coupled to a welding horn. The transducer is capable of generating vibrational energy and transmitting the vibrational energy through the welding horn to an upper surface of the first part. The system also includes a vertical press coupled to the transducer and capable of adjusting a vertical position of the transducer and the welding horn. The system further includes a rotation servo that rotates a fixture for holding the second part. Finally, the system includes a controller electrically coupled to the rotation server. The controller can automatically control the speed and angle of rotation of the second part during the ultrasonic welding process.

In still another embodiment, a non-transient computer readable medium for storing computer code executable by a processor in system for ultrasonically welding a first part to a second part is described. The non-transient computer readable medium contains at least the following: (1) computer code for controlling a frequency and amplitude of vibrations produced by a transducer and transferred to a welding horn, (2) computer code for controlling a vertical press that sets a position of the welding horn, and (3) computer code for controlling a rotation servo capable of rotating a fixture holding the second part.

In still another embodiment, a method for mating two parts in an ultrasonic welding operation when one part must rotate relative to the other part during the ultrasonic welding process is described. The method can be carried out by performing at least the following steps: (1) receiving a first part comprised of a thermoplastic material, (2) forming a second part including an energy director with constant cross-sectional area and a varied height configured to allow the first and second parts to come into contact through a rotation, (3) orienting an upper surface of the second part to come into contact with a welding horn, and (4) rotating the first part into the second part throughout the welding operation. The varied height of the energy director allows a full length of the energy director to come into contact with the first part at approximately the same time, ensuring that an even and structurally sound weld is created.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments may be better understood by reference to the following description and the accompanying

DETAILED DESCRIPTION OF SELECTED EMBODIMENTS

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Ultrasonic welding is a process that can use mechanical vibrations above an audible range that are produced by a welding sonotrode or horn. These vibrations can be directed into two mating parts that are held together under pressure. The resulting friction can cause any material along the mating surfaces of the parts to melt, creating a weld. Often, an energy director is molded into one of the mating parts. The energy director can include a ridge that forms an area of contact between the mating parts. In this manner, all of the ultrasonic energy can be directed through the energy director, causing the energy director to melt and form the weld in the desired area. Normally, an upper part is pressed straight down into a lower part during the welding operation to ensure that approximately equal amounts of ultrasonic energy are applied along the length of the energy director. However, by varying the height of the energy director while maintaining a constant cross-sectional area, the lower part can be rotated into the upper part during the welding process.

Figure 1:
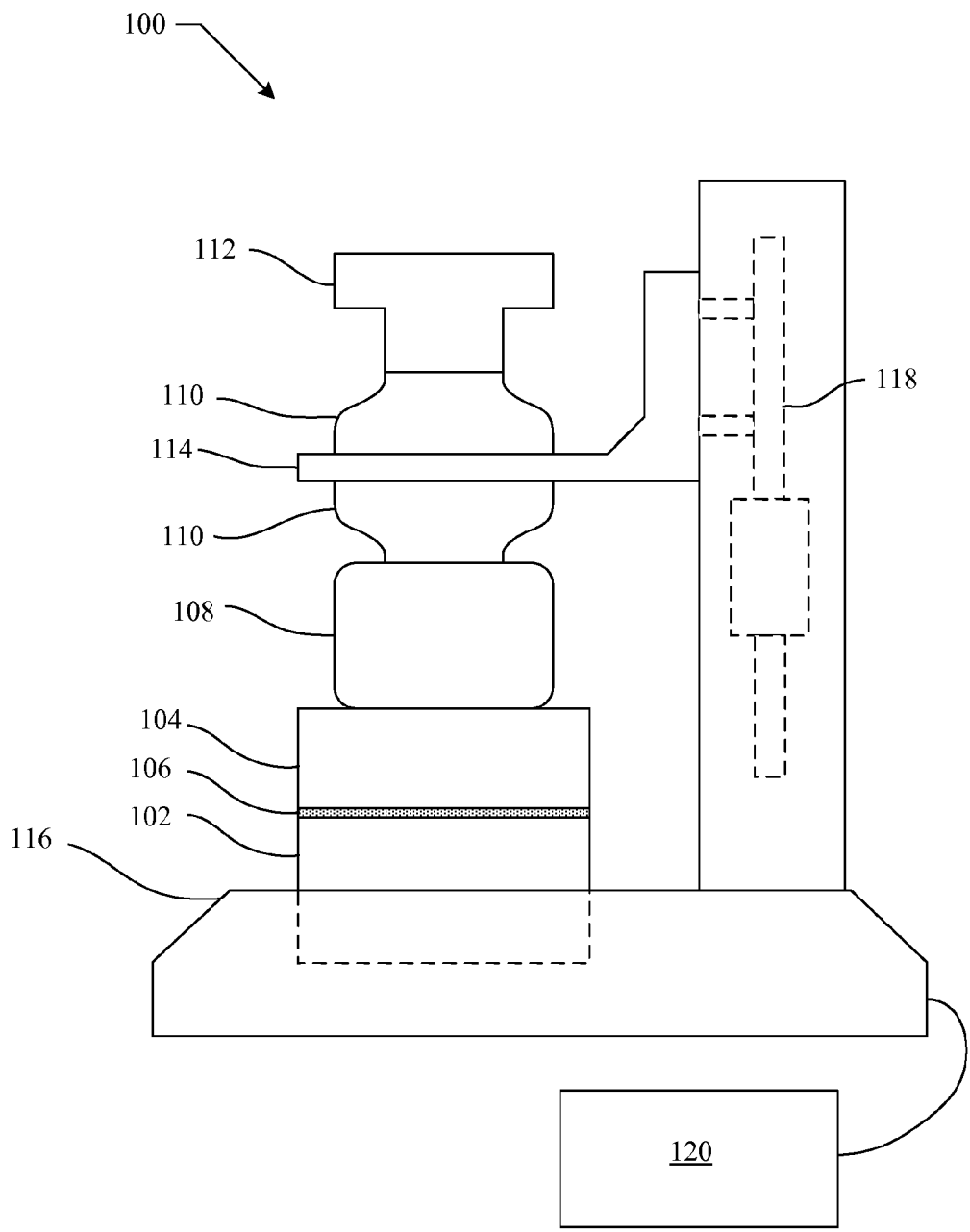
FIG. 1 shows a prior art ultrasonic welding process.
Figure 2:
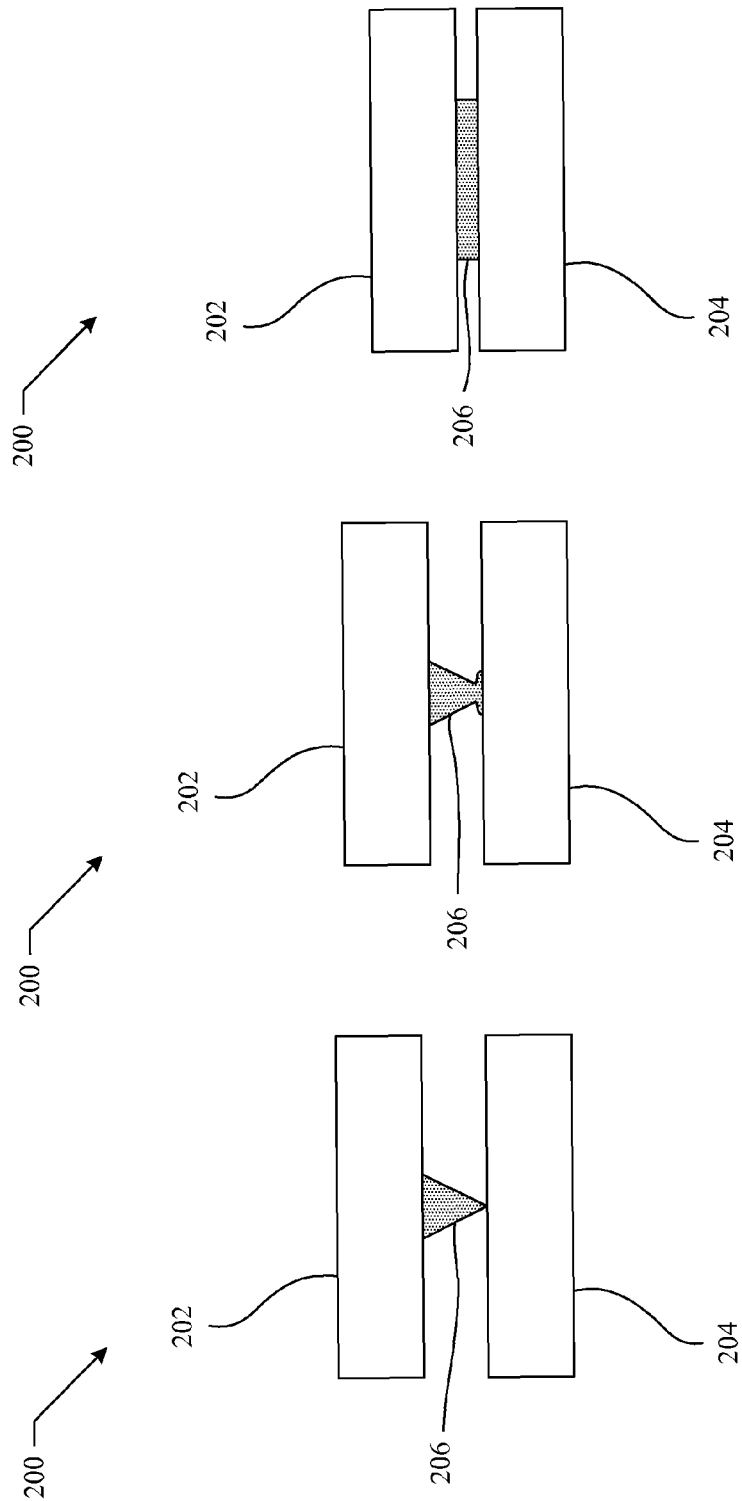
FIG. 2A shows a prior art cross-sectional view of an energy director prior to the ultrasonic welding process.
FIG. 2B shows a prior art cross-sectional view of an energy director during the ultrasonic welding process.
FIG. 2C shows a prior art cross-sectional view of an energy director following the ultrasonic welding process.

FIG. 1 shows a prior art apparatus 100 for performing an ultrasonic welding operation. Lower part 102 can be held in place by base 116, and upper part 104 can be placed above lower part 102. Lower part 102 and upper part 104 can be formed from a plastic material with a low enough melting temperature that heat created by the ultrasonic welding process can quickly melt the material. However, other materials with a low melting temperature other than plastics can be used as well. Moreover, it is not necessary that upper part 104 and lower part 102 be made from the same material so long as both materials have approximately equal melting temperatures. Energy director 106 can be included in either upper part 104 or lower part 102 and can form a region of contact between upper part 104 and lower part 102. For a more detailed view of energy director 106, see FIG. 2.

Transducer 112 can be positioned near the top of ultrasonic welding apparatus 100 and can convert electrical energy from a generator to mechanical vibrations used in the welding process. Transducer 112 can include a number of piezo-electric ceramic discs sandwiched between two metal blocks. Between each of these ceramic disks, a thin metal plate can be positioned forming an electrode. Then, a sinusoidal electrical signal can be fed to the transducer via the electrodes, causing the ceramic discs to expand and contract. This motion can produce an axial peak-to-peak movement of up to about 100 µm. Booster 110 can be positioned below transducer 112. Booster 110 can amplify the mechanical vibrations produced at the tip of the transducer and transfer the vibrations to welding horn 108. In addition, booster 110 can provide an attachment point for arm 114.

Welding horn 108 can be positioned between booster 110 and upper part 104. Welding horn 108 is typically formed from either aluminum or titanium, but can be formed from any suitably robust material. Furthermore, welding horn 108 can be tuned to provide additional mechanical gain to the system, increasing an amount of energy transferred to the upper part. Pneumatic press 118 can exert a downward pressure on upper part 104 and lower part 102 through arm 114. It is not necessary that press 118 be pneumatic and any other technically feasible means of generating pressure can be used. The combination of pressure exerted by pneumatic press 118 and vibrations generated by transducer 112 can create an amount of heat in energy director 106 sufficient to melt energy director 106 and form a bond between upper part 104 and lower part 102. Controller 120 can be electrically connected to the apparatus and can be used to control the frequency and amplitude of vibrations produced by transducer 112 as well as the amount of force exerted by pneumatic press 118.

FIGS. 2A-2C show a series of prior art magnified cross-sectional views of an energy director melting to form a weld during an ultrasonic welding operation 200. In FIG. 2A, upper part 202 can be positioned above lower part 204. Energy director 206 can be molded into upper part 202. In another embodiment, energy director 206 can be molded into lower part 204 and reversed so that the apex of the triangle is pointing upwards towards upper part 202. Generally, a triangular shape for energy director 206 can be considered advantageous because the ultrasonic energy can be concentrated along the apex of the triangle during the initial stage of the welding process. However, a triangular shape is not necessary and other shapes such as a uniform rectangular ridge can be used as well. FIG. 2B shows a cross-sectional view of energy director 206 just after the ultrasonic welding process has begun. The ultrasonic energy can be concentrated at the tip of energy director 206, causing that portion to melt first. As this occurs, pressure from pneumatic press 118 can continue to force upper part 202 downwards into lower part 204, bring the solid portion of energy director 206 into contact with lower part 204 and continuing the melting process. FIG. 2C shows a cross-sectional view of energy director 206 after the ultrasonic welding operation is completed. The heat caused by the pressure and vibrations can fully melt energy director 206 and the pressure can allow the melted material to flow outwards and form a weld between upper part 202 and lower part 204.

Figure 3:
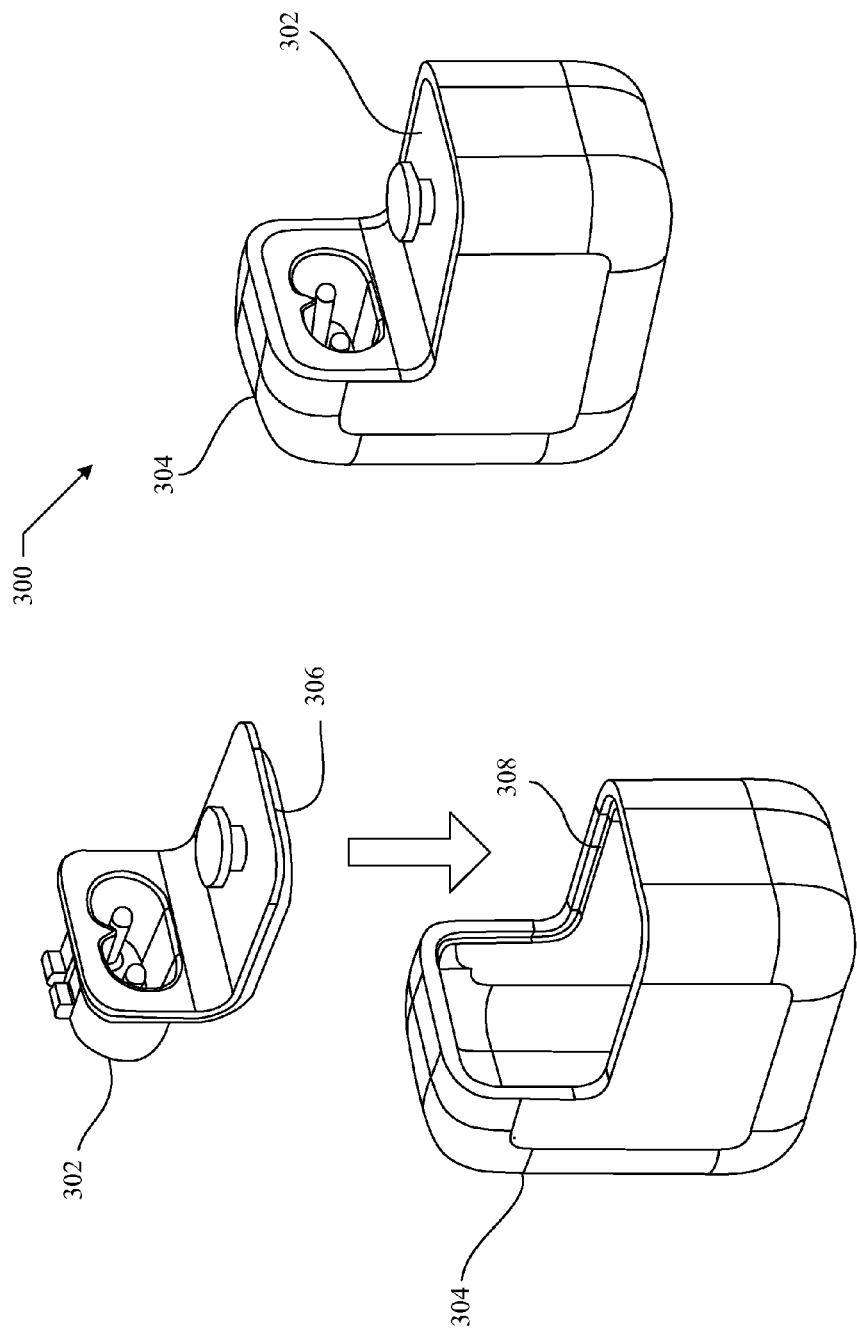
FIG. 3 shows a power adapter assembly that can be joined using an ultrasonic welding process.

FIG. 3 shows a power adapter 300 that can be formed using an ultrasonic welding method described in the present disclosure. Power adapter 300 is meant as an example application in which a rotation can be required during an ultrasonic welding process and the disclosed method is not limited to assembly of power adapters or similar devices. Power adapter 300 can include AC inlet assembly 302 and housing 304. Both AC inlet 302 and housing 304 can be formed from any material with a melting point sufficiently low to melt during the ultrasonic welding process. For example, many plastic materials can be used. In one embodiment, a polycarbonate material can be used to form both AC inlet assembly 302 and housing 304. In other embodiments, AC inlet assembly 302 and housing 304 can be formed from different materials. However, the ultrasonic welding process can be completed more efficiently when the melting points of AC inlet assembly 302 and housing 304 are substantially similar. Lower mating surface 308 can be included along an interior ridge of housing 304. Moreover, upper mating surface 306 can be included along a lower surface of AC inlet 302 and configured to align with mating surface 308. An energy director can be included on either lower mating surface 308 or upper mating surface 306.

Figure 4:
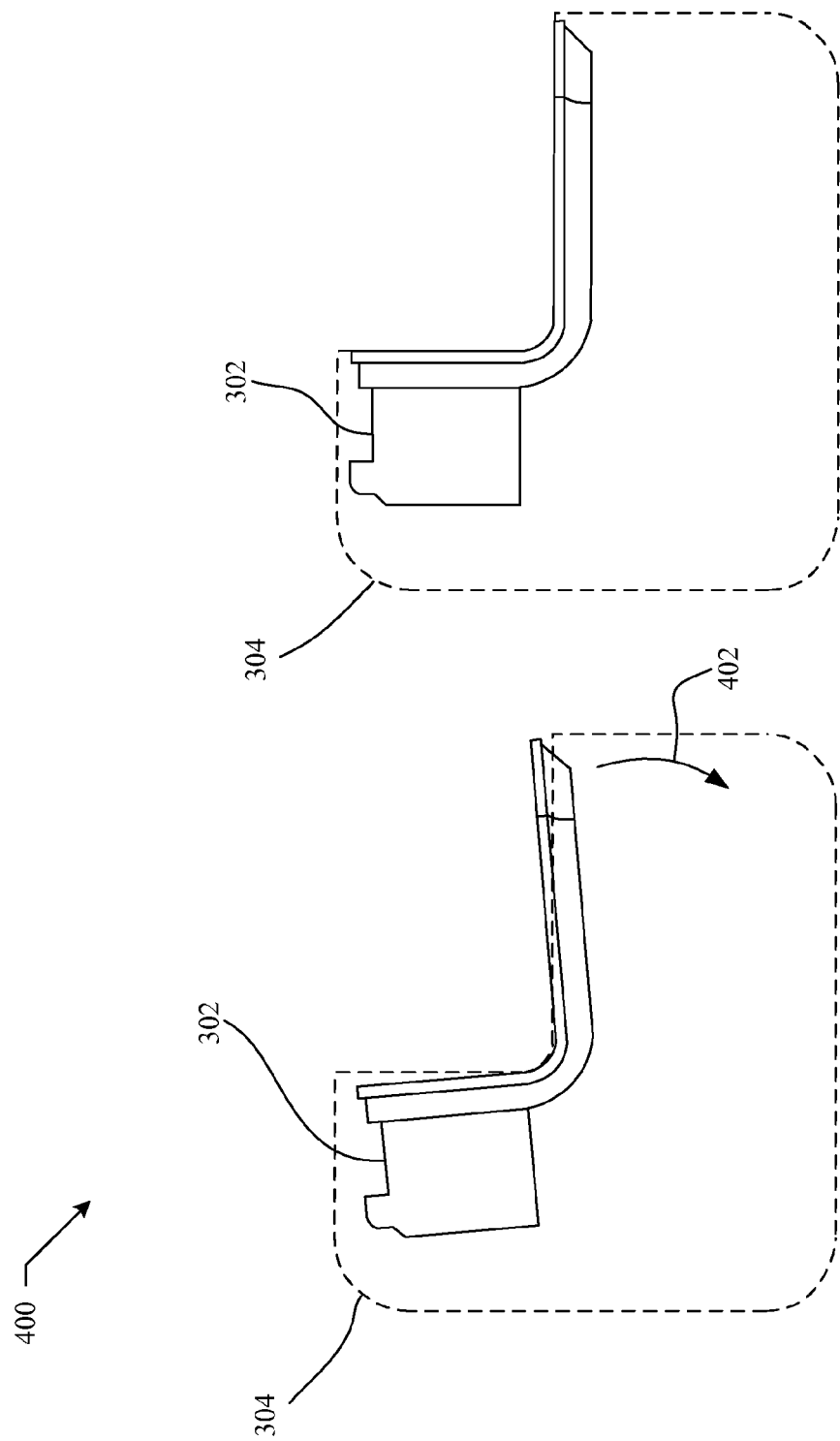
FIG. 4 shows how a rotation can be required during the assembly process for a power adapter.

FIG. 4 shows a side view of power adapter 400, showing a rotation that can take place during a welding process. Due to internal space constraints, AC inlet 302 can be incapable of lowering directly onto housing 304 during a welding operation. Rather, a rotation along direction 402 can be required to allow mating surfaces on AC inlet 302 to correctly align with corresponding mating surfaces on housing 304. Using conventional manufacturing techniques, this can pose a risk that energy directors near a pivot point for the rotation can come into contact with a mating surface first. The resulting uneven contact between the energy director and the mating part can result in a weaker bond and risk damaging the parts being welded. The problem of uneven contact is not limited to the manufacture of power adapters. Similar issues can arise whenever two parts are rotated together during an ultrasonic welding operation. Therefore, the methods described below can be applicable to any application including such rotations.

Figure 5:
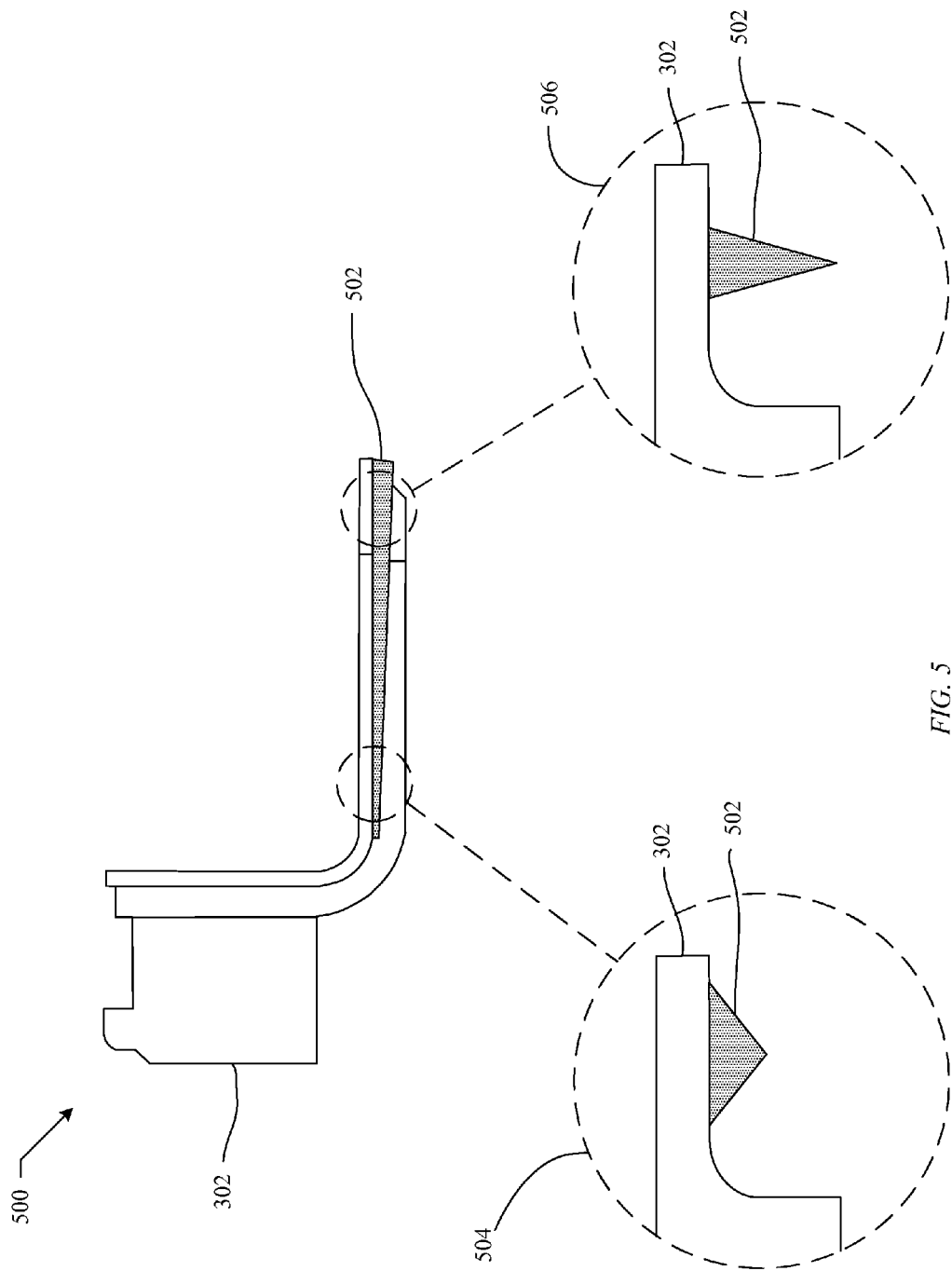
FIG. 5 shows cross-sectional views of a non-uniform energy director.

FIG. 5 shows AC inlet assembly 500 with a non-uniform energy director 502 to account for the rotation 402 shown in FIG. 4. AC inlet 302 can include non-uniform energy director 502 along a surface intended to be welded to housing 304. Energy director 502 can be configured to have a shorter height and wider base near to the pivot point of the rotation and a taller height and narrower base farther from the pivot point. Magnified cross-sectional view 504 shows a possible configuration for energy director 502 near the pivot point, and magnified cross-sectional view 506 shows a possible configuration for energy director 502 farther from the pivot point. The difference in height between cross section 504 and cross section 506 can be configured to account for an initial angle between AC inlet 302 and housing 304 at the beginning of the ultrasonic welding process. In this manner, an entirety energy director 502 can remain in contact with the mating surface on housing 304 at all times during the welding process.

In FIG. 5, non-uniform energy director 502 is shown as included with AC inlet 302. However, in another embodiment, non-uniform energy director 502 can be included in a lower mating part such as housing 304. Moreover, non-uniform energy director 502 can have a non-triangular cross-section. In other embodiments, rectangular cross-sections, rounded cross-sections, or any other technically feasible cross-sectional shape can be used while continuing to vary cross-sectional height according to the distance from the pivot point.

In one embodiment, the cross-sectional area energy director 502 can be configured to remain constant along the length of energy director 502. For example, the product of the height and base of a triangular cross section of energy director 502 can be held constant throughout the energy director. This can ensure that an approximately equivalent amount of material can be melted along the length of energy director 502, increasing a likelihood that an even and structurally sound weld is created. Cross-sectional area can be held constant when energy director 502 has a non-triangular cross-section as well.

Figure 6:
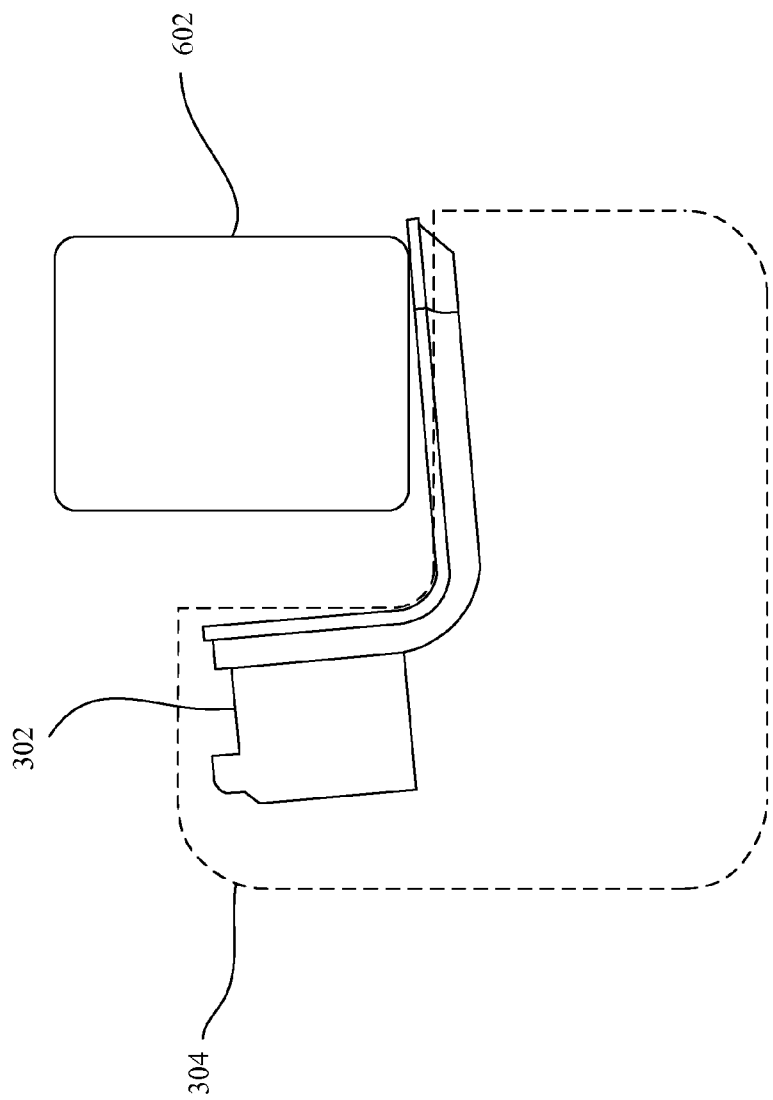
FIG. 6 shows how a welding horn can apply uneven energy if a top part is required to rotate during an ultrasonic welding process.

FIG. 6 shows a side view of AC inlet 302 and housing 304 along with welding horn 602. Welding horn 602 can be most effective in transmitting vibrations to AC inlet 302 when a lower surface of welding horn 602 is parallel and in contact with an upper surface of AC inlet 302. Moreover, if welding horn 602 is not properly aligned with AC inlet 302 and only a corner of welding horn 602 is allowed to contact AC inlet 302, energy can be disproportionately channeled into one end of the welding area, resulting in an uneven and structurally deficient weld. However, the need for AC inlet 302 to rotate during the welding process can prohibit welding horn 602 from being in full contact with the upper surface of AC inlet 302 unless welding horn 602 is allowed to rotate as well. Welding horn 602 can be connected to a rigid assembly including transducers and boosters for creating and amplifying vibrations required for the welding process. Therefore, creating a system in which welding horn 602 can rotate with AC inlet 302 can be costly and overly complicated.

Figure 7:
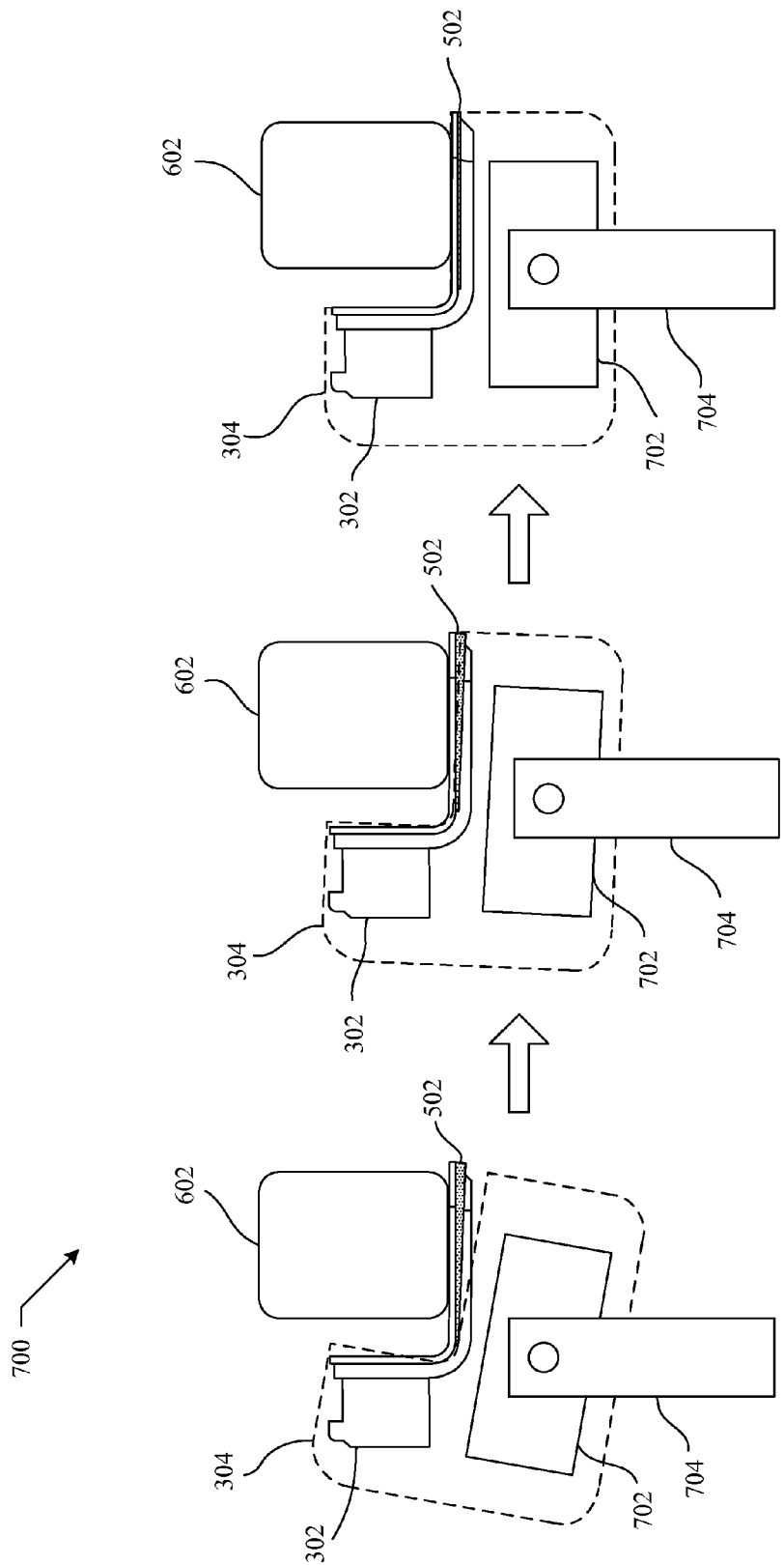
FIG. 7 shows an apparatus for rotating a lower part in a power adapter assembly during an ultrasonic welding process.

FIG. 7 shows system 700 for orienting AC inlet 302 and housing 304 during the welding process while avoiding the problem described in FIG. 6. Rather than rotate welding horn 602, AC inlet 302 can be positioned to remain parallel to welding horn 602 and housing 304 can rotate instead. Fixture 702 can be can be configured to hold housing 304 in place during the welding operation. Fixture 702 can represent a stainless steel clamp or any other technically feasible means of restraining housing 304. Fixture 702 can be mechanically coupled to frame 704 by a hinge mechanism, allowing fixture 702 to rotate about at least one axis relative to frame 704. A servo mechanism can be provided to control an orientation of fixture 702 relative to frame 704 during the welding process. Initially, housing 304 can be placed at an angle relative to AC inlet 302 to allow for any needed clearances. Then, as the ultrasonic welding process begins, fixture 702 can rotate housing 304 so that an entire length of non-uniform energy director 502 can come into contact with a mating surface on housing 304 at approximately the same time. As the welding process completes, fixture 702 can further rotate housing 304 into a final position so that the mating surfaces of AC inlet 302 and housing 304 come into contact. Energy director 502 can fully melt and form a uniform weld, bonding AC inlet 302 and housing 304 together permanently. A protective film can be placed between welding horn 602 and AC inlet 302 to prevent vibrations from welding horn 602 from damaging an exterior surface of AC inlet 302. In one embodiment, a layer of polyethylene terephthalate (PET) material can be used, but any feasible protective film can be used as well.

Figure 8:
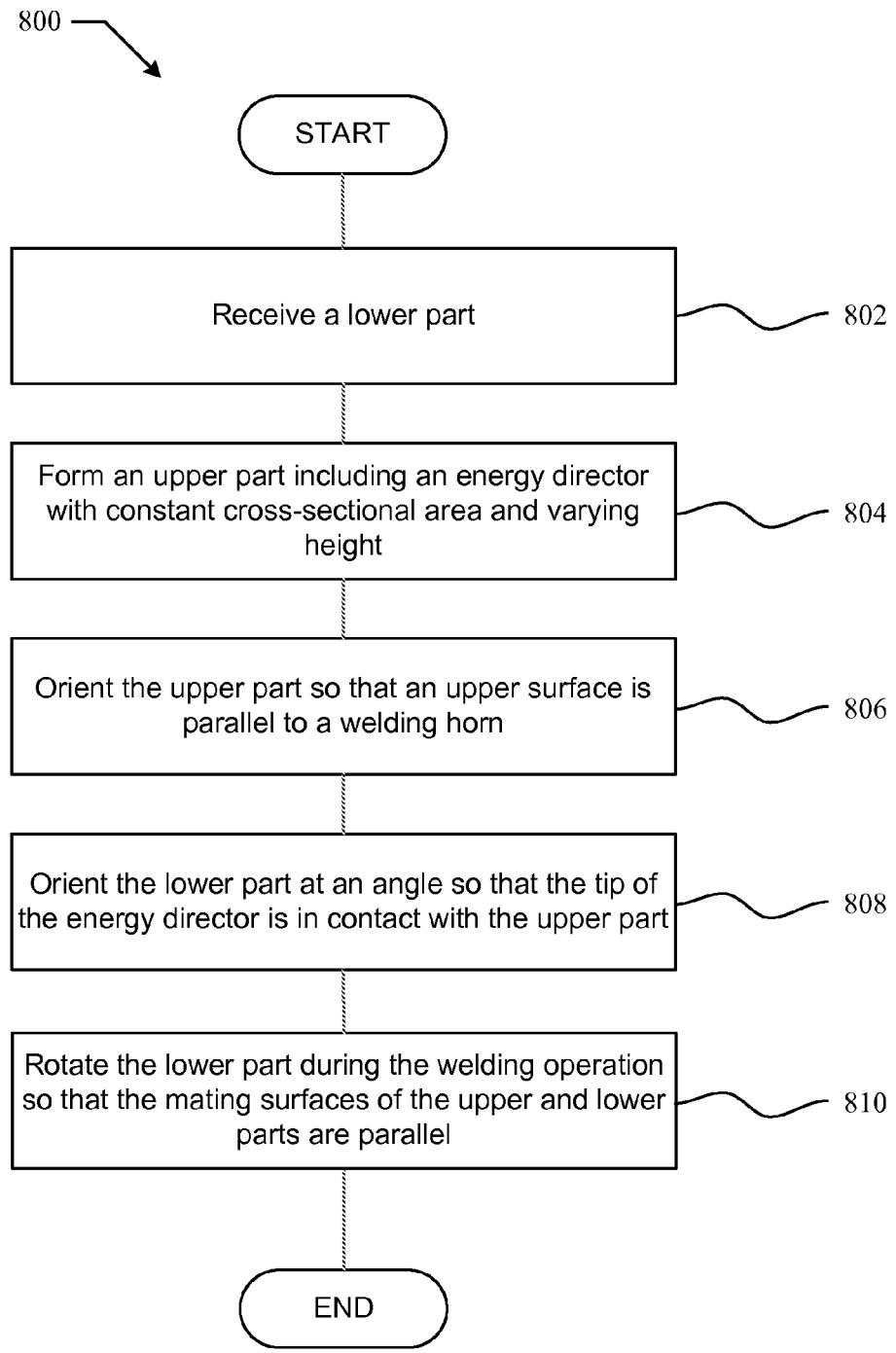
FIG. 8 shows a flow chart describing a process by which two parts can be ultrasonically welded while rotating one part during the welding process.

FIG. 8 shows a flow chart describing process 800 in accordance with the described embodiments. Process 800 can be used when an ultrasonic weld is desired between two parts that rotate relative to each other as they are joined. In step 802, a lower part is received. The lower part can be formed from any material with a melting point low enough for the material to melt in an ultrasonic welding process. In step 804, an upper part configured to mate with the lower part and including an energy director can be formed. In another embodiment, the energy directory can be included in the lower part instead of the upper part. The energy director can be integrally formed with the part with which it is included. In some embodiments, the energy director can have a constant cross-sectional area, but varying height to account for an initial angle at which the upper and lower parts are placed during the welding operation.

In step 806, the upper part can be held in place by an ultrasonic welding apparatus and positioned such that an upper surface of the upper part is parallel and in contact with a welding horn. In step 808, the lower part can be oriented such that the tip of the energy director on the upper part is in full contact with the lower part along the length of the energy director. In one embodiment, the lower part can be positioned by a fixture that can control the rotation of the lower part throughout the welding process. Finally, in step 810, the lower part can be rotated during the welding operation, so that the mating surfaces of the upper and lower parts are brought parallel to each other. In some embodiments, the rotation can be automatically directed by a controller.

Figure 9:
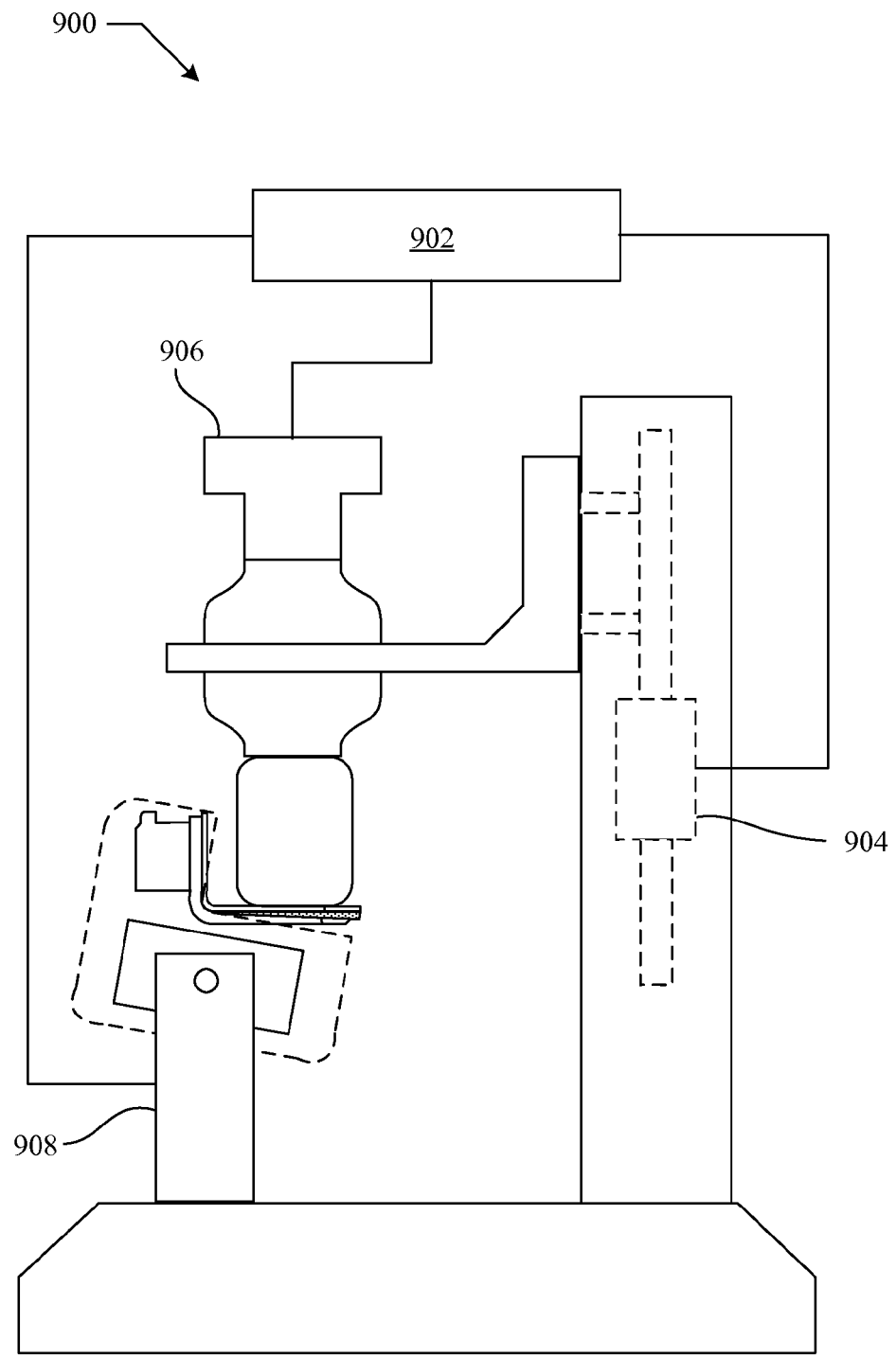
FIG. 9 shows a system for rotating a lower part in a power adapter assembly during an ultrasonic welding process.

FIG. 9 shows system 900, demonstrating a system capable of automating many of the processes described in the present disclosure. System 900 includes controller 902. Controller 902 can send electrical signals to several components associated with an ultrasonic welding process and direct these components to work together. For example, controller 902 can send signals to vertical press 904. Vertical press 904 can move a corresponding ultrasonic welding horn vertically to allow parts to be placed underneath the welding horn. In addition, vertical press 904 can provide downward pressure on an upper part during the ultrasonic welding process. Vertical press 904 can operate using pneumatics, gears, magnets, or any other technically feasible means. In some embodiments, the vertical position and downward force exerted by vertical press 904 can be automatically controlled by controller 902.

In addition, controller 902 can send electrical signals to transducer 906. Transducer 906 can be positioned above a booster and welding horn and can convert electrical energy from a generator to mechanical vibrations used in the welding process. In one embodiment, transducer 906 can include a number of piezo-electric ceramic discs sandwiched between two metal blocks. Between each of these ceramic disks, a thin metal plate can be positioned forming an electrode. Then, a sinusoidal electrical signal can be fed to the transducer via the electrodes, causing the ceramic discs to expand and contract. This motion can produce an axial peak-to-peak movement of up to about 100 μm. In some embodiments, the speed and amplitude of the resulting vibrations can be automatically controlled by controller 902.

Controller 902 can also send electrical signals to rotation servo 908. Rotation servo 908 can rotatably couple a fixture holding a lower part to a fixed frame or structural element. Then, rotation servo 908 can rotate the fixture and the lower part through an appropriate angle during the ultrasonic welding process. In one embodiment, multiple fixtures and rotation servos can be used to form an assembly line that passes underneath the welding horn. In some embodiments, the timing and speed of the rotation can be automatically controlled by controller 902.

Controller 902 can also include a user interface capable of allowing an operator to set parameters related to the ultrasonic welding process. For example, an operator can input a desired rotation speed, rotation angle, vibrational amplitude, or any other parameter related to the process. Furthermore, controller 902 can receive electrical signals from sensors distributed throughout system 900. For example, sensors can detect the location and orientation of the parts being welded, providing controller 902 with information that can be used to control rotation servo 908, vertical press 904, and other components within system 900. Optical sensors, hall effect sensors, mechanical sensors, or any other suitable sensor can be used to send data to controller 902.

Figure 10:
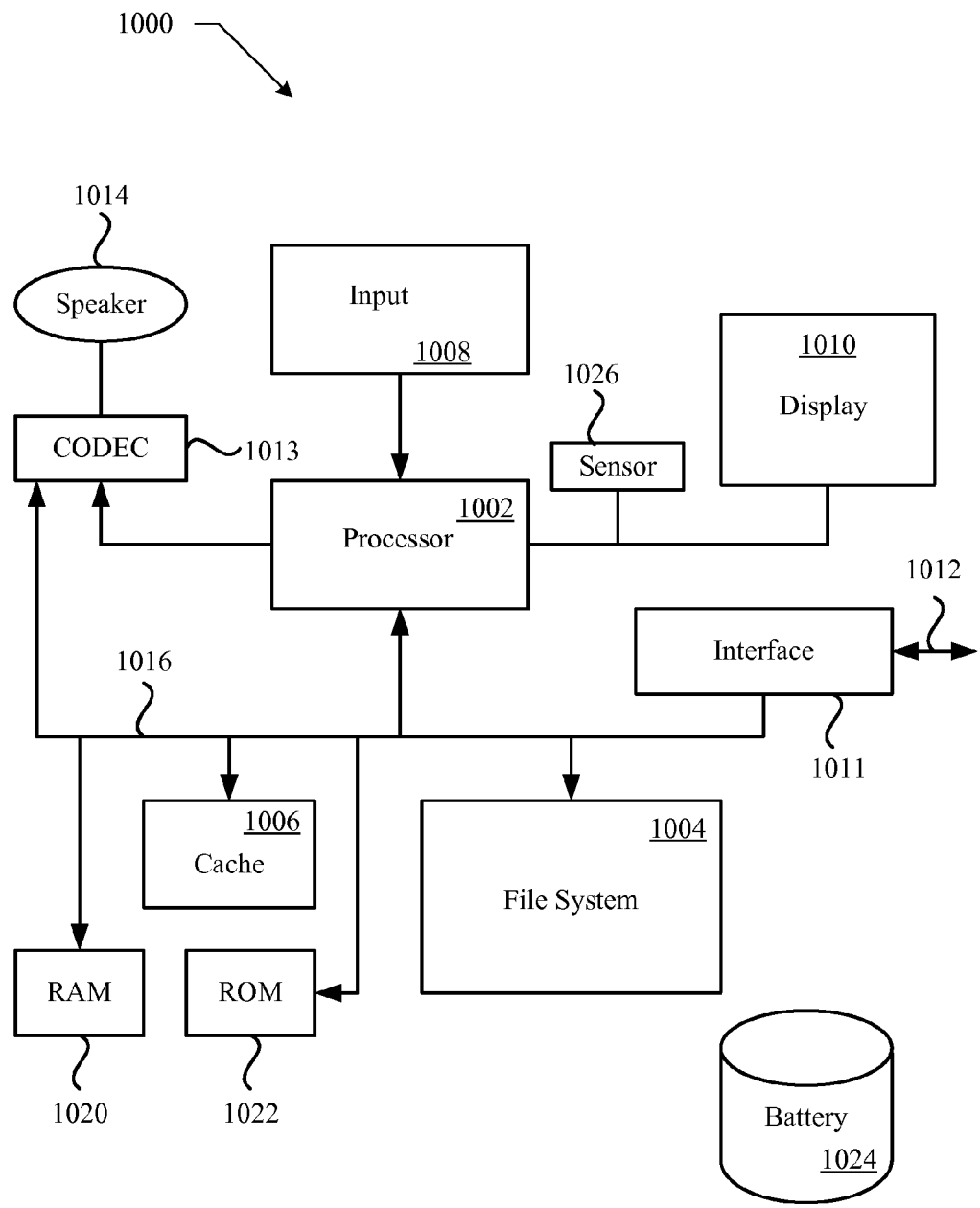
FIG. 10 shows a block diagram for a controller.

FIG. 10 is a block diagram of electronic controller 1000 suitable for controlling some of the processes in the described embodiment. For example, controller 1000 can represent controller 902 shown in FIG. 9. Controller 1000 illustrates circuitry of a representative computing device. Controller 1000 includes a processor 1002 that pertains to a microprocessor or controller for controlling the overall operation of controller 1000. Controller 1000 contains instruction data pertaining to manufacturing instructions in a file system 1004 and a cache 1006. The file system 1004 is, typically, a storage disk or a plurality of disks. The file system 1004 typically provides high capacity storage capability for the controller 1000. However, since the access time to the file system 1004 is relatively slow, the controller 1000 can also include a cache 1006. The cache 1006 is, for example, Random-Access Memory (RAM) provided by semiconductor memory. The relative access time to the cache 1006 is substantially shorter than for the file system 1004. However, the cache 1006 does not have the large storage capacity of the file system 1004. Further, the file system 1004, when active, consumes more power than does the cache 1006. The power consumption is often a concern when the controller 1000 is a portable device that is powered by a battery 1024. The controller 1000 can also include a RAM 1020 and a Read-Only Memory (ROM) 1022. The ROM 1022 can store programs, utilities or processes to be executed in a non-volatile manner. The RAM 1020 provides volatile data storage, such as for cache 1006.

The controller 1000 also includes a user input device 1008 that allows a user of the controller 1000 to interact with the controller 1000. For example, the user input device 1008 can take a variety of forms, such as a button, keypad, dial, touch screen, audio input interface, visual/image capture input interface, input in the form of sensor data, etc. Still further, the controller 1000 includes a display 1010 (screen display) that can be controlled by the processor 1002 to display information to the user. A data bus 1016 can facilitate data transfer between at least the file system 1004, the cache 1006, the processor 1002, and a CODEC 1013. The CODEC 1013 can be used to decode and play a plurality of media items from file system 1004 that can correspond to certain activities taking place during a particular manufacturing process. The processor 1002, upon a certain manufacturing event occurring, supplies the media data (e.g., audio file) for the particular media item to a coder/decoder (CODEC) 1013. The CODEC 1013 then produces analog output signals for a speaker 1014. The speaker 1014 can be a speaker internal or external to the controller 1000. For example, headphones or earphones that connect to the controller 1000 would be considered an external speaker.

The controller 1000 also includes a network/bus interface 1011 that couples to a data link 1012. The data link 1012 allows the controller 1000 to couple to a host computer or to accessory devices. The data link 1012 can be provided over a wired connection or a wireless connection. In the case of a wireless connection, the network/bus interface 1011 can include a wireless transceiver. The media items can be any combination of audio, graphical or visual content. Sensor 1026 can take the form of circuitry for detecting any number of stimuli. For example, sensor 1026 can include any number of sensors for monitoring a manufacturing operation such as for example a Hall Effect sensor responsive to external magnetic field, an audio sensor, a light sensor such as a photometer, and so on.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A method for ultrasonically welding a first part to a second part, comprising: forming an energy director on a surface of the first part configured to mate with the second part, wherein the energy director has a non-uniform cross-section; and applying a vibrational energy to the energy director while rotating the second part relative to the first part;
wherein a height of the non-uniform cross-section increases proportional to a distance from an axis of rotation for the second part, the increase in height being configured to allow an entirety of the energy director to contact a mating surface on the second part while applying the vibrational energy.

2. The method as recited in claim 1, wherein the non-uniform cross-section of the energy director maintains a constant cross-sectional area.

3. The method as recited in claim 2, wherein the non-uniform cross-section of the energy director has a triangular shape.

4. The method as recited in claim 3, wherein a product of a base of the triangular cross-section and a height of the triangular cross-section remains constant throughout the energy director.

5. The method as recited in claim 2, wherein the non-uniform cross-section has a rectangular shape.

6. The method as recited in claim 1, wherein the first part and the second part are made from a same material.

7. The method as recited in claim 6, wherein the first part and the second part are made from a polycarbonate material.

8. The method as recited in claim 7, wherein the energy director is integrally formed with the first part.

9. The method as recited in claim 1, wherein the vibrational energy is applied to an outer surface of the first part using an ultrasonic welding horn.

10. The method as recited in claim 1, wherein the first part is an AC inlet and the second part is a housing for a power adapter.

11. A system for ultrasonically welding a first part to a second part while rotating the second part relative to the first part, the system comprising:
a transducer coupled to a welding horn, wherein the transducer is capable of generating vibrational energy and transmitting the vibrational energy through the welding horn to the first part;
a vertical press coupled to the transducer and capable of adjusting a vertical position of the transducer and welding horn;
a fixture for holding the second part, wherein the fixture is rotatably coupled to a structural support by a rotation servo; and
a controller electrically coupled to the rotation servo, wherein the controller automatically controls a speed and angle of rotation of the second part during an ultrasonic welding process.

12. The system as recited in claim 11, wherein the speed an angle of rotation are configured to allow a non-uniform energy director disposed on the first part to uniformly come into contact with a mating surface on the second part.

13. The system as recited in claim 12, wherein the controller is electrically coupled to the transducer and automatically controls an amplitude and frequency of the vibrational energy.

14. The system as recited in claim 13, wherein the controller is electrically coupled to the vertical press and automatically controls a vertical position of the transducer and welding horn.

15. The system as recited in claim 14, further comprising at least one sensor capable of sensing a position and orientation of the second part, wherein the at least one sensor is electrically coupled to the controller and provides positional data to the controller.

16. A method for ultrasonically welding two parts together while allowing the parts to rotate relative to each other during the welding process, the method comprising:
receiving a first part formed from a thermoplastic material;
forming a second part including at least one energy director disposed on a surface configured to mate with the first part, wherein the at least one energy director maintains an approximately constant cross-sectional area while having a varied height, the varied height configured to allow the first and second parts to come into contact by rotating along an axis;
orienting an upper surface of the second part to be parallel to and in contact with a welding horn, wherein the welding horn is configured to deliver vibrations sufficient to melt the energy director during an ultrasonic welding process;

rotating the first part relative to the second part during the ultrasonic welding process, wherein the rotation allows all areas of the at least one energy director to come into contact with the first part simultaneously; and continuing to rotate the first part until the mating surfaces of the first and second parts are approximately parallel and the at least one energy director melts, forming a weld between the first and second parts.

17. The method as recited in claim 16, wherein height of the at least one energy director is lower near the point of rotation than the height of the at least one energy director is furthest from the point of rotation.

18. The method as recited in claim 16, wherein the profile of the at least one energy director is triangular along the varied height.

19. The method as recited in claim 16, wherein the second part is formed from a thermoplastic material.

20. The method as recited in claim 16, wherein the at least one energy director is integrally formed with the second part.

* * * * *